(12) United States Patent
Wang

(10) Patent No.: US 11,616,044 B2
(45) Date of Patent: Mar. 28, 2023

(54) CHIP PACKAGING METHOD AND PARTICLE CHIPS

(71) Applicant: Shenzhen Newsonic Technologies Co., Ltd., Shenzhen (CN)

(72) Inventor: Jian Wang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/653,472

(22) Filed: Mar. 4, 2022

(65) Prior Publication Data
US 2022/0230987 A1    Jul. 21, 2022

(30) Foreign Application Priority Data
Oct. 20, 2021   (CN) .......................... 202111218638.9

(51) Int. Cl.
*H01L 23/00*    (2006.01)
*H01L 21/56*    (2006.01)
*H01L 23/31*    (2006.01)

(52) U.S. Cl.
CPC ............ *H01L 24/81* (2013.01); *H01L 21/561* (2013.01); *H01L 23/3185* (2013.01); *H01L 24/11* (2013.01); *H01L 24/14* (2013.01); *H01L 24/16* (2013.01); *H01L 24/96* (2013.01); *H01L 24/97* (2013.01); *H01L 2224/14181* (2013.01); *H01L 2224/16225* (2013.01)

(58) Field of Classification Search
CPC ........ H03H 3/02; H03H 9/706; H03H 9/0571; H01L 2224/48091; H01L 2924/3025; H01L 23/3107; H01L 2924/00014; H01L 2924/00; H01L 2224/16225; H01L 2224/14181; H01L 21/561; H01L 23/3185; H01L 24/11; H01L 24/14; H01L 24/16; H01L 24/96; H01L 24/97; H01L 24/81
USPC ........................................ 257/737; 438/613
See application file for complete search history.

(56) References Cited

U.S. PATENT DOCUMENTS

2011/0272795 A1* 11/2011 Chang ............... H01L 23/49579
                                                            257/E21.531
2018/0337142 A1* 11/2018 Cheng .................... H01L 23/04

FOREIGN PATENT DOCUMENTS

CN   112786541 A   5/2021
TW   202103271 A   1/2021

* cited by examiner

*Primary Examiner* — Didarul A Mazumder
(74) *Attorney, Agent, or Firm* — Finnegan, Henderson, Farabow, Garrett & Dunner, LLP

(57) ABSTRACT

A method for packaging chips includes: providing a filter wafer and a plurality of substrates to be packaged, each substrate to be packaged being provided with one or more first pads; flip-chip bonding the substrates to be packaged on the filter wafer; molding the substrates to be packaged to form a molded layer on the substrates to be packaged, the substrates to be packaged, the molded layer, and the filter wafer forming a molded structure, each substrate to be packaged, a portion of the molded layer formed on the substrate to be packaged, and the filter wafer together enclosing a cavity; exposing the first pads out of the molded layer; and cutting the molded structure into a plurality of particle chips.

9 Claims, 10 Drawing Sheets

CHIP PACKAGING METHOD AND PARTICLE CHIPS

CROSS-REFERENCE TO RELATED APPLICATION

This application is based upon and claims priority to Chinese Patent Application 202111218638.9, filed on Oct. 20, 2021, the entire content of which is incorporated herein by reference.

FIELD OF THE DISCLOSURE

The present application relates to the technical field of chip packaging, in particular, to a chip packaging method and particle chips manufactured using the method.

BACKGROUND

At present, conventional filter packaging generally uses a covering process such as dual layers of organic thin films to form a cavity structure that is requisite for the filter, and provides flip-chip solder bumps to complete the packaging at a wafer level. The packaged filter wafer is cut to obtain individual chips, then individual chips are flip-chip bonded to a package substrate, then a molding process is performed, and cutting is performed to obtain particle chips. This method involves flip-chip bonding the packaged filter wafer on the substrate, which does not facilitate the miniaturization of the sizes of particle chips.

SUMMARY

Embodiments of the present disclosure provide a chip packaging method and particle chips manufactured using the same, to facilitate the miniaturization of the sizes of the particle chips.

According to a first aspect of the present disclosure, a method for packaging chips comprises: providing a filter wafer and a plurality of substrates to be packaged, each substrate to be packaged being provided with one or more first pads; flip-chip bonding the substrates to be packaged on the filter wafer; molding the substrates to be packaged to form a molded layer on the substrate to be packaged, the substrates to be packaged, the molded layer, and the filter wafer together forming a molded structure; each substrate to be packaged, a portion of the molded layer formed on the substrate to be packaged, and the filter wafer together enclosing a cavity; exposing the first pads out of the molded layer; and cutting the molded structure into a plurality of particle chips.

According to a second aspect of the present disclosure, there is provided a particle chip which is manufactured by the above method for packaging chips.

Embodiments of the present disclosure provide the method for packaging chips and the particle chips manufactured using the method. The following technical effects can be achieved: the substrates to be packaged are flip-chip bonded on the filter wafer; the substrates to be packaged are molded to form the molded layer on the substrates to be packaged, the substrates to be packaged, the molded layer, and the filter wafer together forming the molded structure; each substrate to be packaged, the portion of the molded layer formed on the substrate to be packaged, and the filter wafer together enclose to form the cavity; the first pads are exposed out of the molded layer; and the molded structure is cut into a plurality of particle chips. As such, with the substrates to be packaged being flip-chip bonded on the filter wafer not yet packaged, the molded layer is formed on each one of the substrates to be packaged, and each substrate to be packaged, the portion of the molded layer formed on the substrate to be packaged, and the filter wafer together enclose to form the cavity, thereby completing the packaging of the filter while completing the packaging of the filter wafer, instead of packaging the filter wafer first and then packaging the filter. As a result, the sizes of the particle chips can be miniaturized, and meanwhile the costs of manufacturing particle chips can be reduced.

The above summary is only exemplary and illustrative and not intended to limit the present application.

BRIEF DESCRIPTION OF THE DRAWINGS

One or more embodiments will be exemplarily depicted with reference to the accompanying figures. These exemplary depictions and figures do not limit the embodiments. Elements denoted by the same reference numbers in the figures are same or like elements.

REFERENCE NUMERALS

Figure 1:
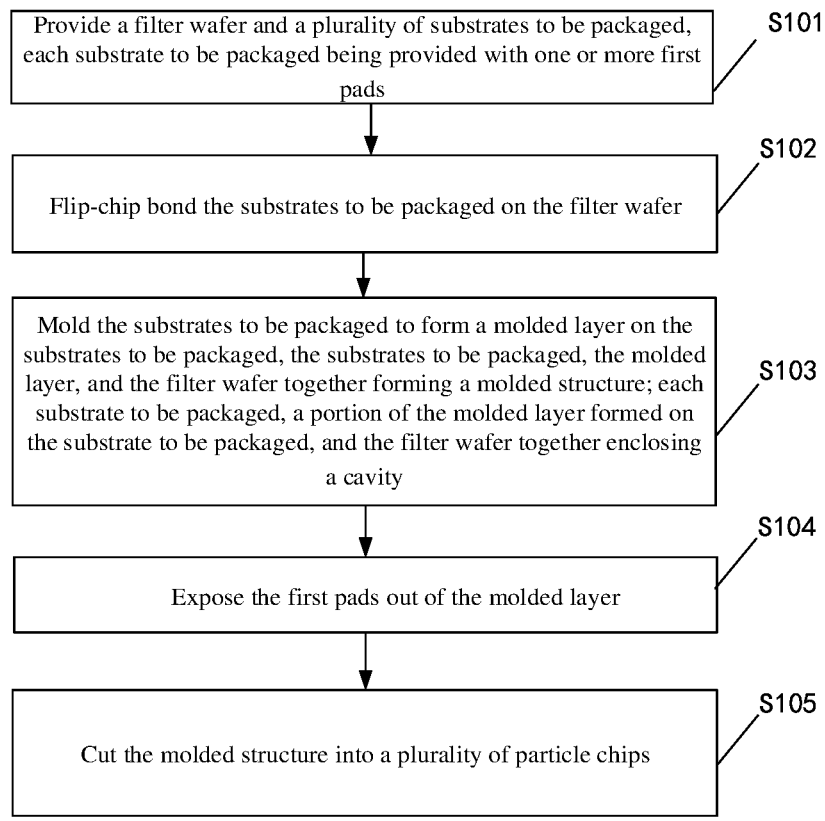
FIG. 1 is a flow chart of a method for packaging chips according to an embodiment.

100: substrate to be cut; 110: first pad; 120: second pad; 130: supporting layer; 140: first solder bump; 150: wafer substrate to be packaged; 160: third pad; 170: first organic thin film; 180: second organic thin film; 190: second solder bump.

DETAILED DESCRIPTION

Implementations of embodiments of the present disclosure will be described in detail below with reference to the accompanying figures. The figures are only for illustration purposes and not intended to limit embodiments of the present disclosure. The implementations set forth in the following description of exemplary embodiments do not represent all implementations consistent with the present disclosure. Instead, they are merely examples of methods and devices consistent with aspects of the disclosure as recited in the appended claims.

Terms such as "first" and "second" in the present disclosure are intended to distinguish similar objects, not necessarily to describe a specific order or sequential order. It should be appreciated that data used in this way may be interchangeable in proper cases to help the embodiments of the present disclosure described herein to be implemented. In addition, terms "include" and "have" and their variants are intended to cover inclusion without excluding others.

In embodiments of the present disclosure, directional or positional relationship indicated by terms such as "up", "down", "on", "in", "interior", "out", "front" and "rear" is based on the directional or positional relationship shown in the figures. These terms are mainly intended to describe embodiments of the present disclosure, not to limit that the described devices, elements or components must have a specific orientation or must be configured and operated in a specific orientation. Furthermore, in addition to indicating the directional or positional relationship, the above partial terms might also be used to convey other meanings, for example, the term "on" might also be used to indicate a dependency relationship or connectional relationship in some cases. Those having ordinary skill in the art may understand specific meanings of these terms in the embodiments of the present disclosure according to specific situations.

In addition, terms "dispose", "connect" and "fix" should be understood in a broad sense. For example, "connect" may be fixed connection, detachable connection or integral connection, may be mechanical connection or electrical connection, may be direct connection, or indirect connection through an intermediate medium, or may be internal communication between two devices, elements or components. Those having ordinary skill in the art may understand specific meanings of the above terms in the embodiments of the present disclosure according to specific situations.

The term "and/or" is an association relationship describing objects, and indicates there may be three types of relationships. For example, "A and/or B" indicates three types of relationships, namely, "A", "B", or "A and B".

Embodiments of the present disclosure and features in the embodiments may be combined with one another without confliction.

Referring to FIG. 1, an embodiment of the present disclosure provides a method for packaging chips, comprising:

Step S101: providing a filter wafer and a plurality of substrates to be packaged, each substrate to be packaged being provided with one or more first pads;

Step S102: flip-chip bonding the substrates to be packaged on the filter wafer;

Step S103: molding the substrates to be packaged to form a molded layer on the substrates to be packaged, the substrates to be packaged, the molded layer, and the filter wafer together forming a molded structure, and each substrate to be packaged, a portion of the molded layer formed on the substrate to be packaged, and the filter wafer together enclosing a cavity;

Step S104: exposing the first pads out of the molded layer; and

Step S105: cutting the molded structure into a plurality of particle chips.

By the method for packaging chips according to the present embodiment, the substrates to be packaged are flip-chip bonded on the filter wafer; the substrates to be packaged are molded to form a molded layer on the substrates to be packaged, the substrates to be packaged, the molded layer, and the filter wafer together form the molded structure; each substrate to be packaged, a portion of the molded layer formed on the substrate to be packaged, and the filter wafer together enclose the cavity; the first pads are exposed out of the molded layer; and the molded structure is cut into a plurality of particle chips. In this way, with the substrates to be packaged being flip-chip bonded on the filter wafer not yet packaged, the molded layer is formed on the substrates to be packaged, and each substrate to be packaged, the portion of the molded layer formed on the substrate to be packaged, and the filter wafer together enclose to form the cavity, thereby completing the packaging of a filter while completing the packaging of the filter wafer, instead of packaging the filter wafer first and then packaging the filter. As a result, the sizes of the particle chips can be miniaturized, and meanwhile the costs of manufacturing particle chips can be reduced.

In some embodiments, the particle chip has a function of a filter.

Figure 2:
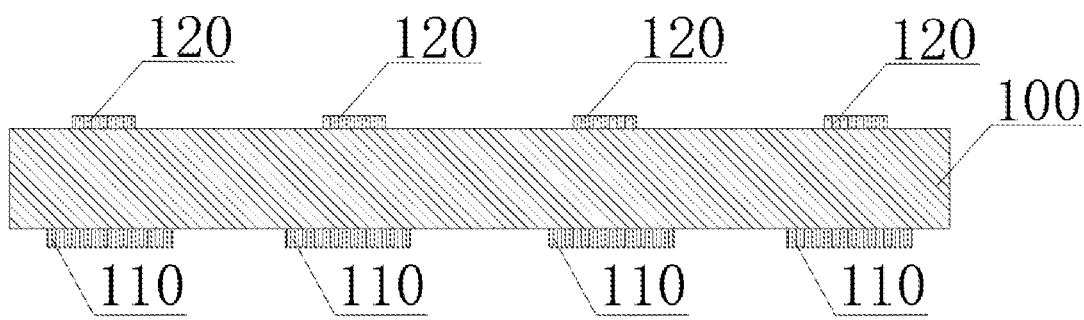
FIG. 2 is a schematic diagram of a substrate to be cut according to an embodiment.
Figure 4:
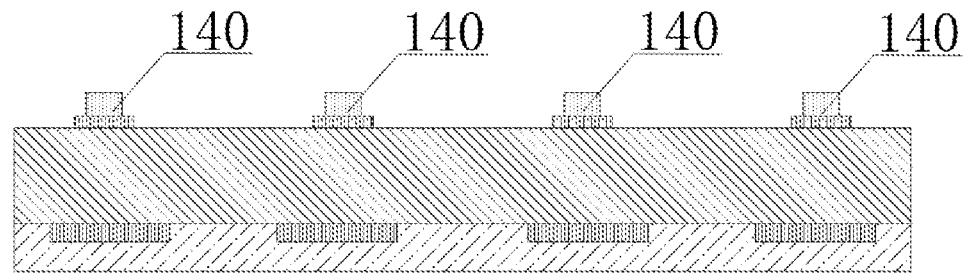
FIG. 4 is a schematic diagram after first solder bumps are disposed on the substrate to be cut according to an embodiment.
Figure 5:
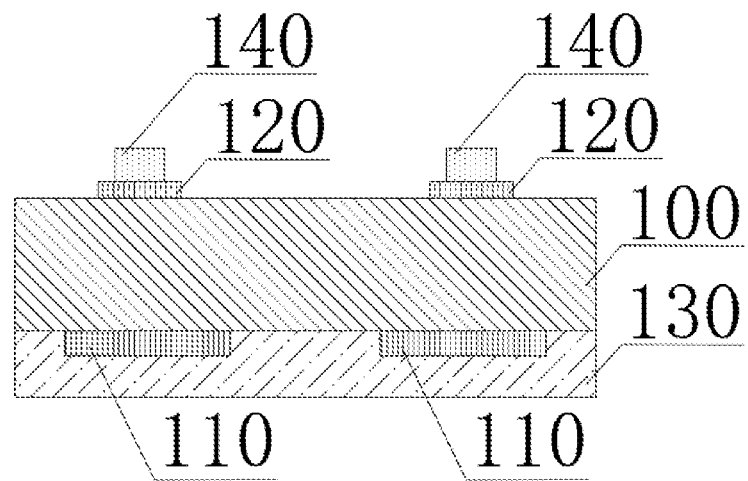
FIG. 5 is a schematic diagram of a substrate to be packaged according to an embodiment.

In some embodiments, the plurality of substrates to be packaged are obtained in the following manner. As shown in FIG. 2, a substrate 100 to be cut is provided. A plurality of first pads 110 are disposed on a first side of the substrate 100 to be cut. A plurality of second pads 120 are disposed on a second side of the substrate 100 to be cut, the second side being away from the first pads 110. As shown in FIG. 4, a plurality of first solder bumps 140 are disposed on the plurality of second pads 120, respectively. As shown in FIG. 5, the substrate 100 to be cut is cut to obtain a plurality of substrates 100 to be packaged. Each substrate 100 to be packaged is provided with one or more first pads 110 and one or more second pads 120 with first solder bumps 140.

In some embodiments, the first solder bumps 140 are made of a material adapted for flip-chip bonding, for example, one or more of a solder ball, a copper post, a gold bump and a conductive glue.

In some embodiments, the substrate 100 to be cut is a PCB (Printed Circuit Board) substrate or a ceramic substrate.

Figure 3:
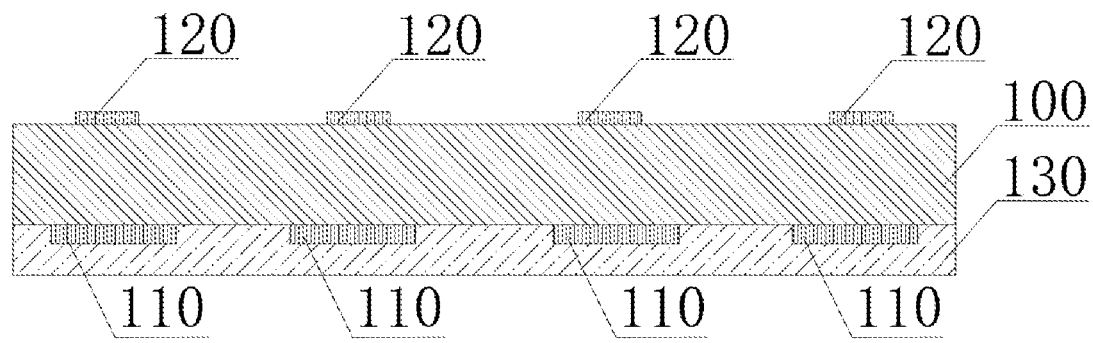
FIG. 3 is a schematic diagram after a supporting layer is disposed on the substrate to be cut according to an embodiment.

In some embodiments, as shown in FIG. 3, after the substrate 100 to be cut is provided, the method further comprises: applying a supporting layer 130 on the first side of the substrate 100 to be cut where the first pads 110 are disposed, the supporting layer 130 covering the first pads 110.

As such, in a case where the strength of the substrate 100 to be cut is insufficient for a subsequent packaging process, the supporting layer 130 can be applied to support the substrate 100 to be cut for the subsequent process.

In some embodiments, the supporting layer 130 is made of a PP (polypropylene) medium or ceramic material.

In some embodiments, in a case where the supporting layer 130 is applied to the first side of the substrate 100 to be cut where the first pads 110 are provided, the substrate 100 to be cut is cut to obtain a plurality of substrates 100 to be packaged as shown in FIG. 5.

Figure 6:
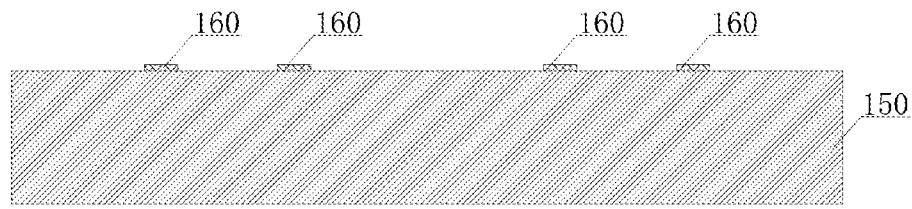
FIG. 6 is a schematic diagram of a filter wafer according to an embodiment.

FIG. 6 is a schematic diagram of a filter wafer according to an embodiment. The filter wafer comprises a wafer substrate 150 to be packaged for encapsulating a plurality of chips to be packaged, and a plurality of third pads 160 for connecting with the second pads 120 of the substrates 100 to be packaged.

In some embodiments, the first pads 110, the second pads 120, and the third pads 160 are all made of an electrically conductive material, such as a metal.

In some embodiments, the flip-chip bonding method is solder reflow soldering, metal ultrasonic welding, or conductive glue bonding.

Figure 7:
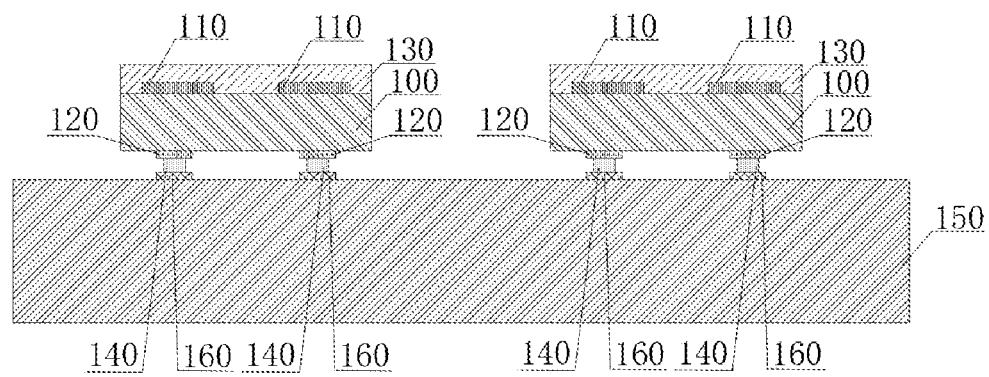
FIG. 7 is a schematic diagram after substrates to be packaged are flip-chip bonded to the filter wafer according to an embodiment.

In some embodiments, as shown in FIG. 7, after the substrates 100 to be packaged are flip-chip bonded on the filter wafer, the second pads 120 of the substrates 100 to be packaged are connected with the third pads 160 of the filter wafer through the first solder bumps 140, respectively.

Figure 8:
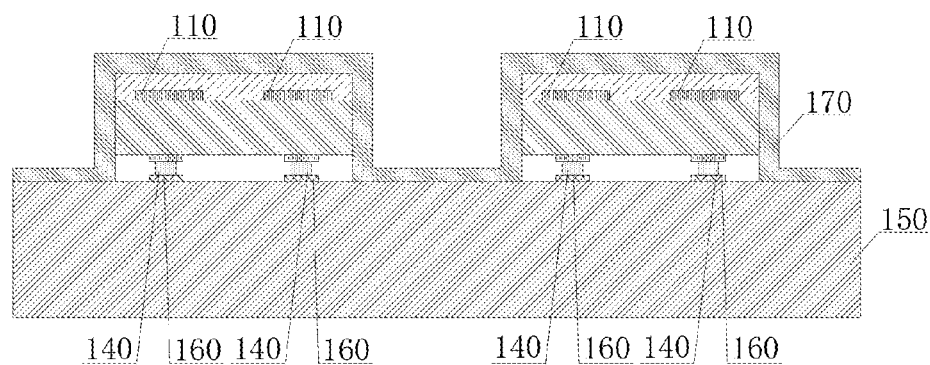
FIG. 8 is a schematic diagram showing a first organic thin film is formed on the substrates to be packaged according to an embodiment.

In some embodiments, as shown in FIG. 8, the molding the substrates 100 to be packaged to form the molded layer on the substrates 100 to be packaged comprises: applying a first organic thin film 170 to the substrates 100 to be packaged, the first organic thin film 170 constituting the molded layer.

Figure 9:
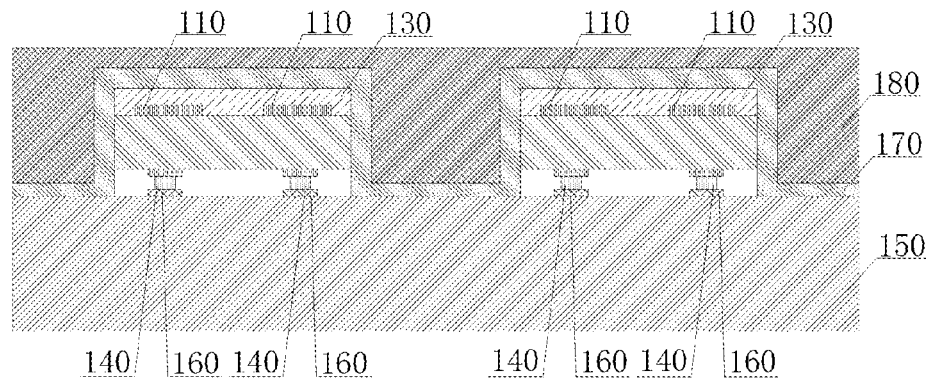
FIG. 9 is a schematic diagram showing a second organic thin film is formed on the substrates to be packaged according to an embodiment.

In some embodiments, as shown in FIG. 9, the molding the substrates 100 to be packaged to form the molded layer on the substrates 100 to be packaged comprises: applying a first organic thin film 170 to the substrates to be packaged, and applying a second organic thin film 180 to a side of the first organic thin film 170 away from the substrates 100 to be packaged, the first organic thin film 170 and the second organic thin film 180 together constituting the molded layer.

The organic thin films 170 and 180 are applied to the surface of the filter wafer in a vacuum environment, so that the organic thin films 170 and 180 can well encapsulate the substrates 100 to be packaged along side walls of the substrates 100 to be packaged soldered on the filter wafer. As a result, each substrate 100 to be packaged, the molded layer including the organic thin films 170 and 180 formed on the substrate 100 to be packaged, and the filter wafer can form a cavity.

In some embodiments, the first organic thin film 170 is made of a dry film or a molding thin film.

In some embodiments, the second organic thin film 180 is made of a dry film or a molding thin film.

In some embodiments, the materials of the first organic thin film 170 and the second organic thin film 180 may be the same or different.

In some embodiments, the exposing the first pads 110 out of the molded layer comprises: thinning the molded layer to expose the first pads out of the molded layer.

Figure 10:
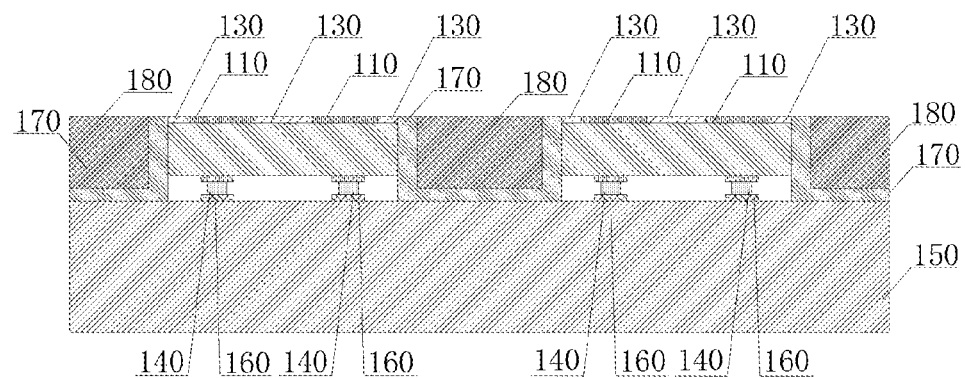
FIG. 10 is a schematic diagram after a molded layer and the supporting layer are thinned according to an embodiment.

In some embodiments, the exposing the first pads 110 out of the molded layer comprises: thinning the molded layer and the supporting layer 130 to expose the first pads 110 out of the molded layer. FIG. 10 is a schematic diagram after the molded layer (including the first and second organic films 170 and 180) and the supporting layer 130 are thinned.

Figure 11:
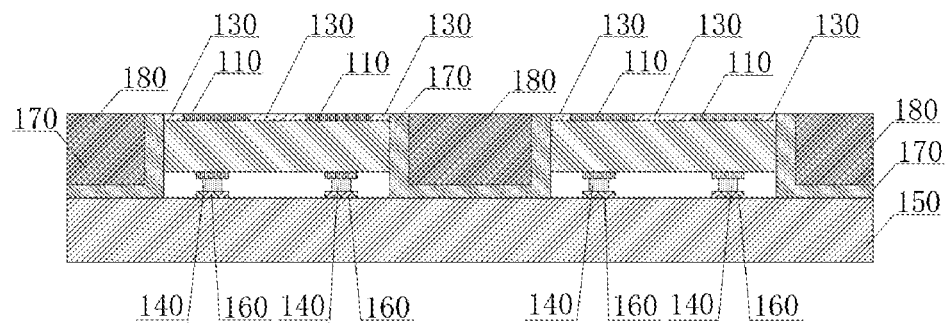
FIG. 11 is a schematic diagram after the filter wafer is thinned according to an embodiment.

In some embodiments, after exposing the first pads 110 out of the molded layer, the method further comprises: thinning the filter wafer (i.e., thinning the wafer substrate 150 of the filter wafer) to a preset thickness. FIG. 11 is a schematic diagram after the filter wafer is thinned to the preset thickness.

In some embodiments, the molded layer and the supporting layer 130 are thinned by a grinding process, and the filter wafer is thinned to a preset thickness by at least one of a grinding process or a chemical etching process.

Figure 12:
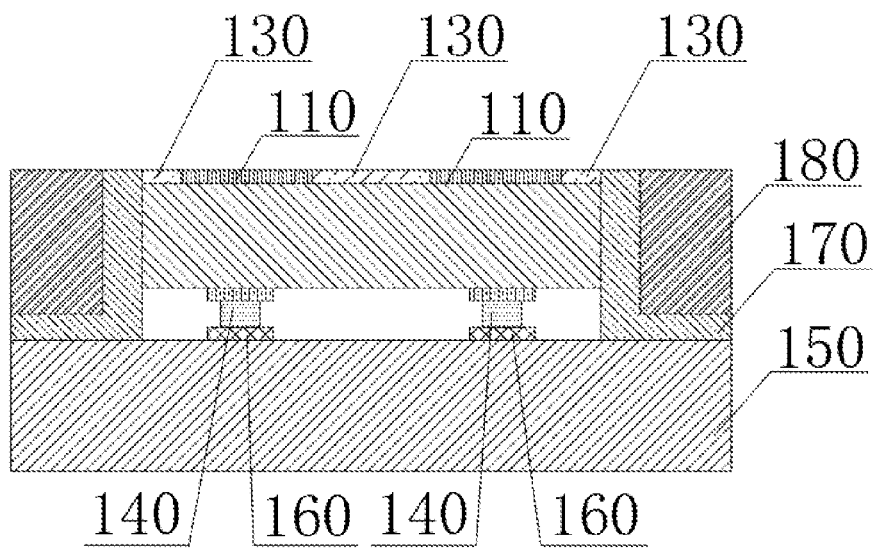
FIG. 12 is a schematic diagram of a particle chip according to an embodiment.

In some embodiments, the molded structure is cut into a plurality of particle chips, as shown in FIG. 12. FIG. 12 is a schematic diagram of a particle chip.

Figure 13:
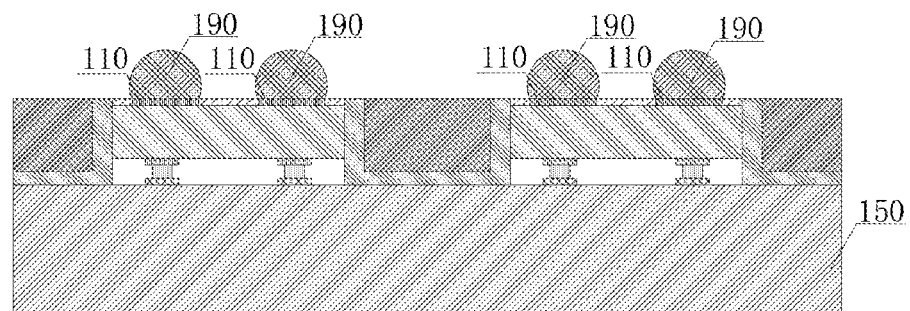
FIG. 13 is a schematic diagram after second solder bumps are disposed on the first pads according to an embodiment.

In some embodiments, as shown in FIG. 13, after exposing the first pads 110 out of the molded layer, the method further comprises: disposing second solder bumps 190 on the first pads 110, respectively.

Figure 14:
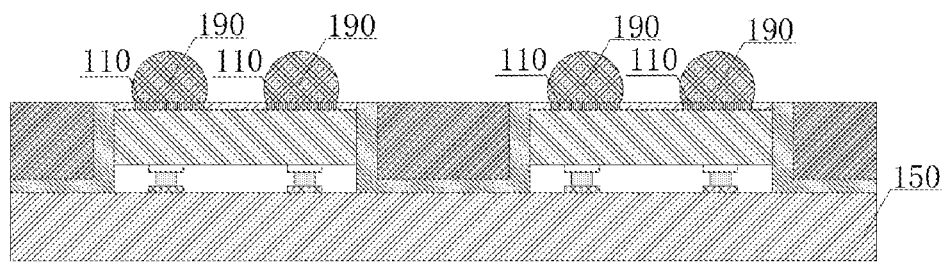
FIG. 14 is a schematic diagram after the filter wafer is thinned according to an embodiment.
Figure 15:
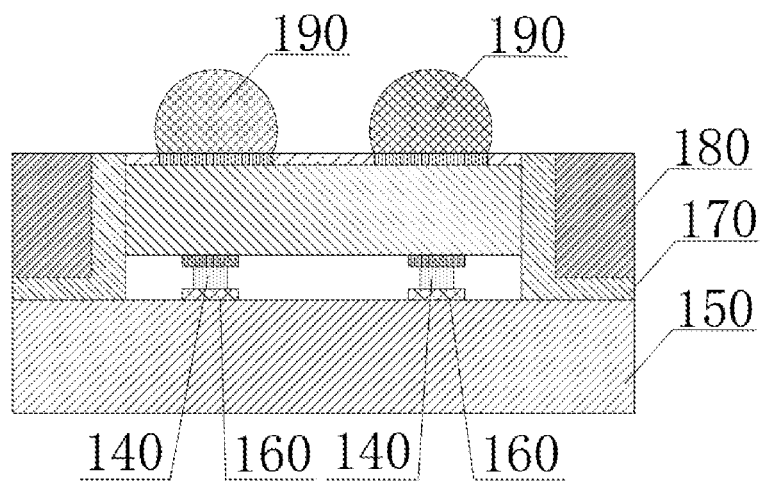
FIG. 15 is a schematic diagram of a particle chip according to an embodiment.

In some embodiments, after the first pads 110 are exposed out of the molded layer, the second solder bumps 190 are disposed on the first pads 110, respectively, then the filter wafer (i.e., the wafer substrate 150 of the filter wafer) is thinned to the preset thickness, as shown in FIG. 14; then the molded structure is cut into a plurality of particle chips, as shown in FIG. 15.

In some embodiments, the second solder bumps 190 are made of a material adapted for flip-chip bonding, for example one or more of a solder ball, a copper post, a gold bump and a conductive glue.

In some embodiments, an RDL (redistribution layer) layer is disposed on the first pads 110, and the second solder bumps 190 are formed on the RDL layer.

Figure 16:
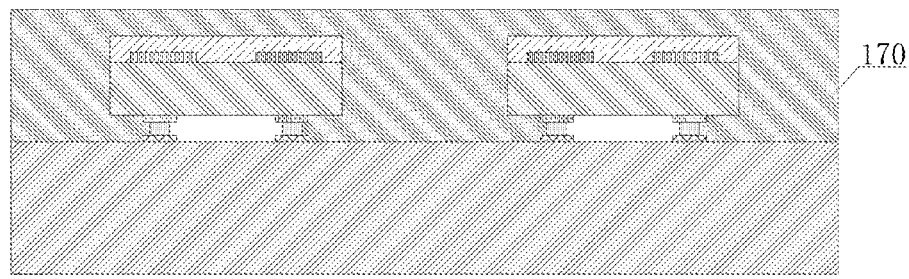
FIG. 16 is a schematic diagram after a first organic thin film is formed on the substrates to be packaged according to an embodiment.
Figure 17:
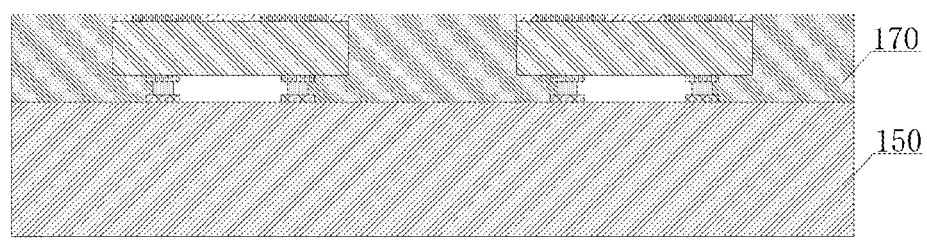
FIG. 17 is a schematic diagram after the molded layer is thinned according to an embodiment.
Figure 18:
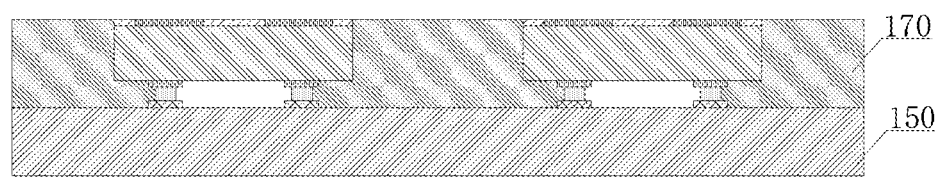
FIG. 18 is a schematic diagram after the filter wafer is thinned according to an embodiment.
Figure 19:
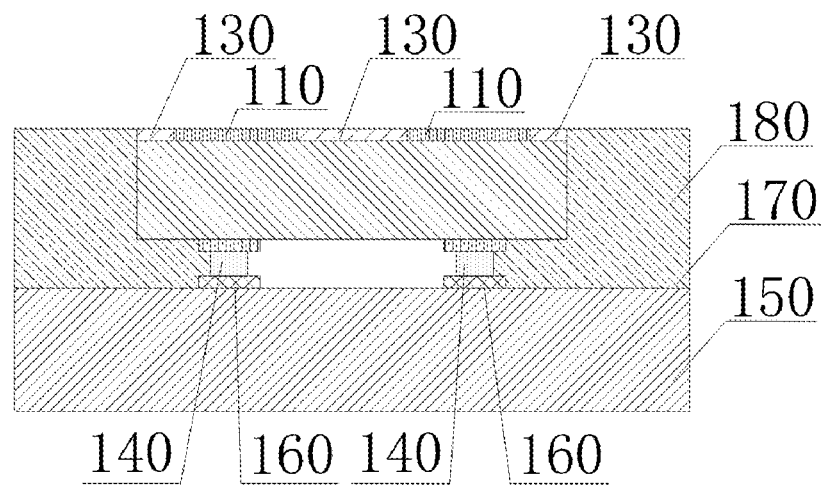
FIG. 19 is a schematic diagram of a particle chip according to an embodiment.

In some embodiments, in a case where the first organic thin film 170 serves as the molded layer, the first organic thin film 170 is formed on the substrates 100 to be packaged, as shown in FIG. 16; the first organic thin film 170 is thinned to expose the first pads 110 out of the first organic thin film 170, as shown in FIG. 17; the filter wafer (i.e., the wafer substrate 150 of the filter wafer) is thinned to a preset thickness, as shown in FIG. 18; and then the molded structure is cut into a plurality of particle chips, as shown in FIG. 19.

Figure 20:
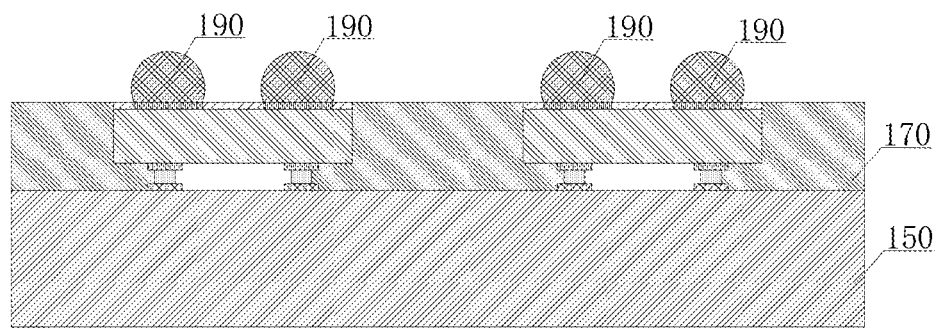
FIG. 20 is a schematic diagram after second solder bumps are disposed on first pads according to an embodiment.
Figure 21:
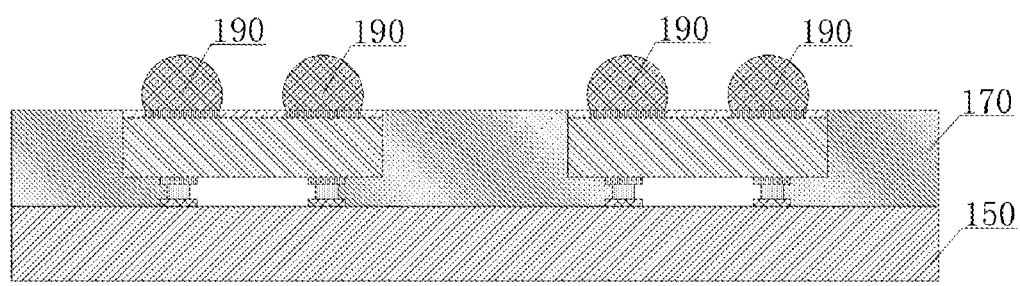
FIG. 21 is a schematic diagram after the filter wafer is thinned according to an embodiment.
Figure 22:
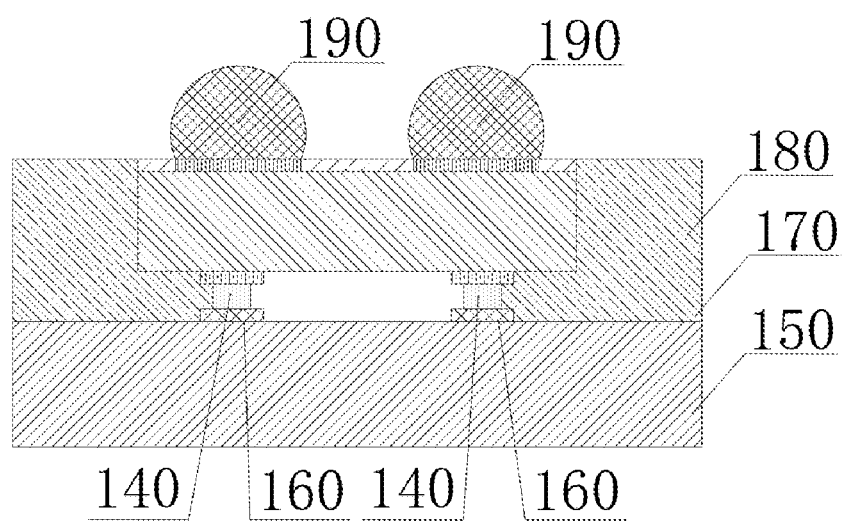
FIG. 22 is a schematic diagram of a particle chip according to an embodiment.

In some embodiments, in a case where the first organic thin film 170 serves as the molded layer, the first organic thin film 170 is thinned to expose the first pads 110 out of the first organic thin film 170; the second solder bumps 190 are disposed on the first pads 110, respectively, as shown in FIG. 20; then the filter wafer (i.e., the wafer substrate 150 of the filter wafer) is thinned to a preset thickness, as shown in FIG. 21; then the molded structure is cut into a plurality of particle chips, as shown in FIG. 22.

Figure 23:
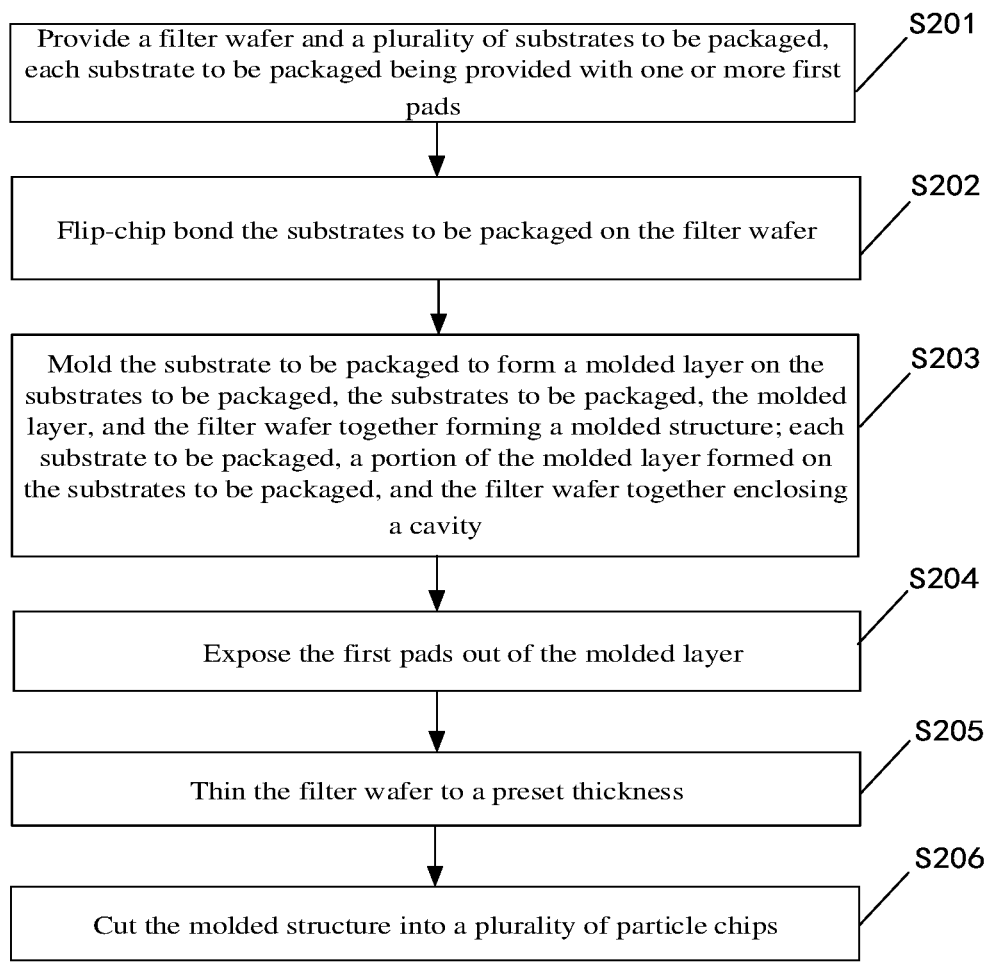
FIG. 23 is a flow chart of a method for packaging chips according to an embodiment.

Referring to FIG. 23, an embodiment of the present disclosure provides a method for packaging chips, comprising:

Step S201: providing a filter wafer and a plurality of substrates to be packaged, each substrate to be packaged being provided with one or more first pads;

Step S202: flip-chip bonding the substrates to be packaged on the filter wafer;

Step S203: molding the substrates to be packaged to form a molded layer on the substrates to be packaged, the substrates to be packaged, the molded layer, and the filter wafer together forming a molded structure, and each substrate to be packaged, a portion of the molded layer formed on the substrate to be packaged, and the filter wafer together enclosing a cavity;

Step S204: exposing the first pads out of the molded layer;

Step S205: thinning the filter wafer to a preset thickness; and

Step S206: cutting the molded structure into a plurality of particle chips.

By the method for packaging chips according to the present embodiment, the substrates to be packaged are flip-chip bonded on the filter wafer; the substrates to be packaged are molded to form the molded layer on the substrates to be packaged, the substrates to be packaged, the molded layer, and the filter wafer together forming the molded structure; each substrate to be packaged, the portion of the molded layer formed on the substrate to be packaged, and the filter wafer together enclose the cavity; the first pads are exposed out of the molded layer; and the molded structure is cut into a plurality of particle chips. In this way, with the substrates to be packaged being flip-chip bonded on the filter wafer not yet packaged, the molded layer is formed on the substrates to be packaged, and each substrate to be packaged, the portion of the molded layer formed on the substrate to be packaged, and the filter wafer together enclosing the cavity, thereby completing the packaging of the filter while completing the packaging of the filter wafer, instead of packaging the filter wafer first and then packaging the filter. As a result, the sizes of the particle chips can be miniaturized, and meanwhile the costs of manufacturing particle chips can be reduced.

Figure 24:
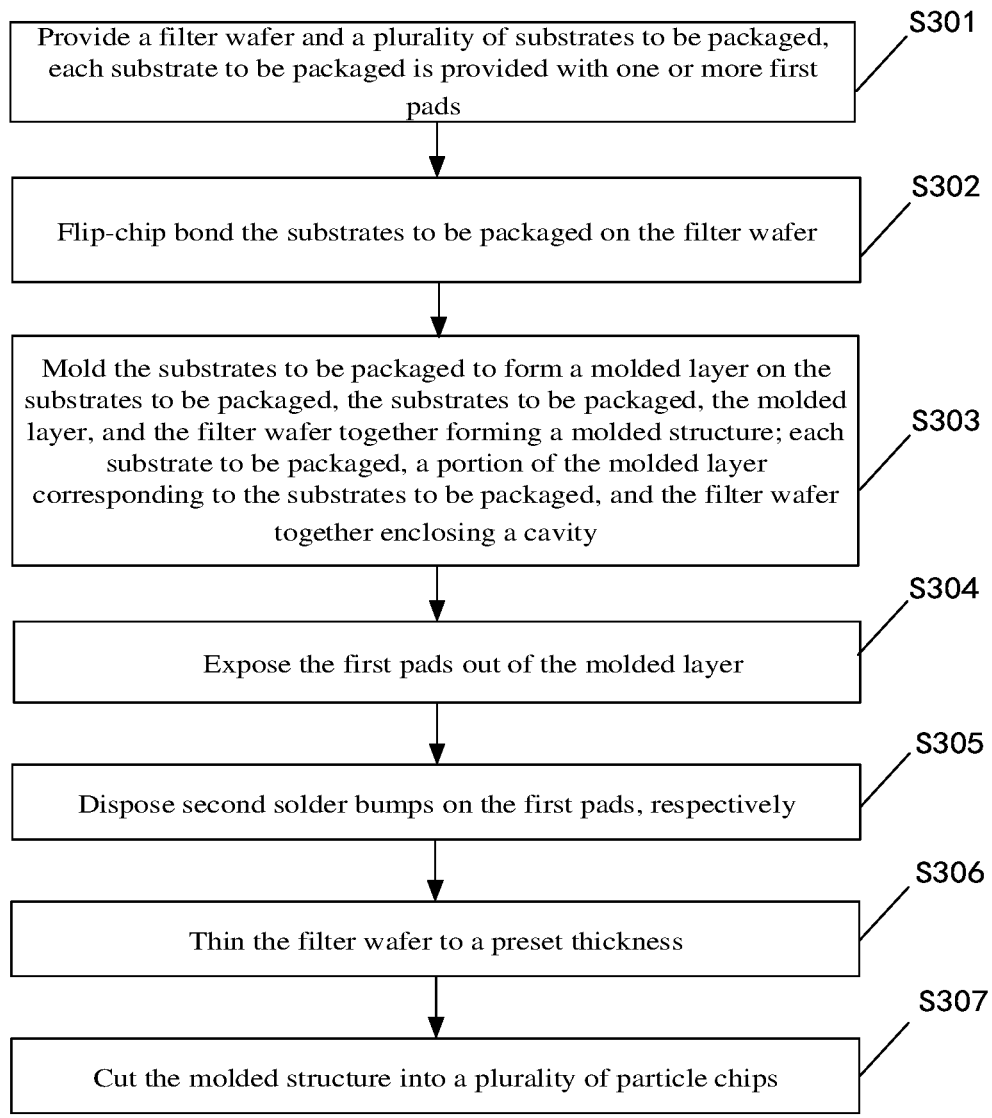
FIG. 24 is a flow chart of a method for packaging chips according to an embodiment.

Referring to FIG. 24, an embodiment of the present disclosure provides a further method for packaging chips, comprising:

Step S301: providing a filter wafer and a plurality of substrates to be packaged, each substrate to be packaged being provided with one or more first pads;

Step S302: flip-chip bonding the substrates to be packaged on the filter wafer;

Step S303: molding the substrates to be packaged to form a molded layer on the substrates to be packaged, the substrates to be packaged, the molded layer, and the filter wafer together forming a molded structure, and each substrate to be packaged, a portion of the molded layer formed on the substrate to be packaged, and the filter wafer together enclosing a cavity;

Step S304: exposing the first pads out of the molded layer;

Step S305: disposing second solder bumps on the first pads, respectively;

Step S306: thinning the filter wafer to a preset thickness;

Step S307: cutting the molded structure into a plurality of particle chips.

By the method for packaging chips according to the present embodiment, the substrates to be packaged are flip-chip bonded on the filter wafer; the substrates to be packaged are molded to form the molded layer on the substrates to be packaged, the substrates to be packaged, the molded layer, and the filter wafer together forming the molded structure; each substrate to be packaged, the portion of the molded layer formed on the substrate to be packaged, and the filter wafer together enclose the cavity; the first pads are exposed out of the molded layer; the molded structure is cut into a plurality of particle chips. In this way, with the substrates to be packaged being flip-chip bonded on the filter wafer not yet packaged, the molded layer is formed on the substrates to be packaged, and each substrate to be packaged, the portion of the molded layer formed on the substrate to be packaged, and the filter wafer together enclose the cavity, thereby completing the packaging of the filter while completing the packaging of the filter wafer, instead of packaging the filter wafer first and then packaging the filter. As a result, the sizes of the particle chips can be miniaturized, and meanwhile the costs of manufacturing particle chips can be reduced.

An embodiment of the present disclosure provides a particle chip which is manufactured by the methods for packaging chips according to embodiments of the present disclosure.

To produce the particle chips according to the present embodiment, the substrates to be packaged are flip-chip bonded on the filter wafer not yet packaged, the molded layer is formed on the substrates to be packaged, and each substrate to be packaged, the portion of the molded layer formed on the substrate to be packaged, and the filter wafer together enclose the cavity, thereby completing the packaging of the filter while completing the packaging of the filter wafer, instead of packaging the filter wafer first and then packaging the filter. As a result, the sizes of the particle chips can be miniaturized, and meanwhile the costs of manufacturing particle chips can be reduced.

In some embodiments, the filter wafer is used to support the substrates to be packaged; each substrate to be packaged is provided with one or more first pads, and the substrates to be packaged are flip-chip bonded on the filter wafer; each substrate to be packaged, the portion of the molded layer formed on the substrate to be packaged, and the filter wafer together enclose a cavity; the first pads are exposed out of the molded layer. In some embodiments, second solder bumps are respectively disposed on the first pads.

The above descriptions and drawings sufficiently illustrate the embodiments of the present disclosure to enable those skilled in the art to implement them. Unless otherwise explicitly required, the individual components and functions described above are optional, and the order of operations may be changed. Parts and features of some embodiments may be included in or may replace parts and features of other embodiments. Moreover, the terms used in the present application are only used to describe the embodiments and not to limit the claims. In the present disclosure, each embodiment may focus on the differences from other embodiments, and the same or similar portions between all embodiments may be referred to mutually. For the methods, products, etc. disclosed in the embodiments, if they correspond to the method portion disclosed in the embodiments, reference may be made to the depictions of the method portion for the relevant parts.

What is claimed is:

1. A method for packaging chips, comprising:
providing a filter wafer and a plurality of substrates to be packaged, each substrate of the plurality of substrates to be packaged being provided with one or more first pads;
flip-chip bonding the plurality of substrates to be packaged on the filter wafer;
molding the plurality of substrates to be packaged to form a molded layer on the plurality of substrates to be packaged, wherein the plurality of substrates to be packaged, the molded layer, and the filter wafer together form a molded structure, and each substrate to be packaged, a portion of the molded layer formed on the substrate to be packaged, and the filter wafer together enclose a cavity;

exposing the one or more first pads out of the molded layer; and cutting the molded structure into a plurality of particle chips, wherein exposing the one or more first pads out of the molded layer comprises: thinning the molded layer to expose the one or more first pads out of the molded layer.

2. The method according to claim 1, wherein providing the plurality of substrates to be packaged comprises:

providing a substrate to be cut, a plurality of first pads being disposed on a first side of the substrate to be cut, and a plurality of second pads being disposed on a second side of the substrate to be cut that is away from the plurality of first pads;

disposing a plurality of first solder bumps on the plurality of second pads, respectively;

cutting the substrate to be cut to obtain the plurality of substrates to be packaged, each substrate of the plurality of substrates to be packaged being provided with the one or more first pads and one or more second pads with one or more of the plurality of first solder bumps.

3. The method according to claim 2, further comprising:

after providing the substrate to be cut, applying a supporting layer on the first side of the substrate to be cut where the one or more first pads are disposed, the supporting layer covering the one or more first pads.

4. The method according to claim 3, wherein the exposing the one or more first pads out of the molded layer further comprises:

thinning the supporting layer to expose the one or more first pads out of the molded layer.

5. The method according to claim 1, further comprising:

thinning the filter wafer to a preset thickness after exposing the one or more first pads out of the molded layer.

6. The method according to claim 1, further comprising:

disposing one or more second solder bumps on the one or more first pads, respectively, after exposing the one or more first pads out of the molded layer.

7. A particle chip, wherein the particle chip is manufactured by the method for packaging chips according to claim 1.

8. The particle chip according to claim 7, comprising:

the filter wafer for supporting the plurality of substrates to be packaged;

a substrate to be packaged provided with the one or more first pads, the substrate to be packaged being flip-chip bonded on the filter wafer; and a molded layer enclosing a cavity together with the filter wafer and the substrate to be packaged, the one or more first pads being exposed out of the molded layer.

9. The particle chip according to claim 8, further comprising:

one or more second solder bumps disposed on the one or more first pads, respectively.

* * * * *